(12) United States Patent
Cho et al.

(10) Patent No.: US 11,757,011 B2
(45) Date of Patent: Sep. 12, 2023

(54) SEMICONDUCTOR DEVICE WITH NON-VOLATILE MEMORY CELL AND MANUFACTURING METHOD THEREOF

(71) Applicant: KEY FOUNDRY CO., LTD., Cheongju-si (KR)

(72) Inventors: Min Kuck Cho, Cheongju-si (KR); Jae Hoon Kim, Cheongju-si (KR); Seung Hoon Lee, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 0 days.

(21) Appl. No.: 17/529,695

(22) Filed: Nov. 18, 2021

(65) Prior Publication Data
US 2022/0359674 A1    Nov. 10, 2022

(30) Foreign Application Priority Data
May 7, 2021   (KR) .................. 10-2021-0059550

(51) Int. Cl.
| H01L 21/28 | (2006.01) |
| H01L 29/788 | (2006.01) |
| H10B 41/35 | (2023.01) |
| H01L 29/66 | (2006.01) |
| H01L 29/423 | (2006.01) |

(52) U.S. Cl.
CPC .. H01L 29/40114 (2019.08); H01L 29/42328 (2013.01); H01L 29/66825 (2013.01); H01L 29/788 (2013.01); H10B 41/35 (2023.02)

(58) Field of Classification Search
None
See application file for complete search history.

(56) References Cited

U.S. PATENT DOCUMENTS

| 6,091,104 | A  | 7/2000  | Chen |
| 6,642,103 | B2 | 11/2003 | Wils et al. |
| 6,784,476 | B2 | 8/2004  | Kim et al. |
| 6,803,276 | B2 | 10/2004 | Kim et al. |
| 6,885,058 | B2 | 4/2005  | Wils et al. |
| 7,611,941 | B1* | 11/2009 | Shum ............... H01L 29/40114 |
|           |    |         | 438/211 |
| 8,143,663 | B2 | 3/2012  | Jeong |

(Continued)

FOREIGN PATENT DOCUMENTS

| KR | 10-2003-0030055 A | 4/2003 |
| KR | 10-2014-0083366 A | 7/2014 |
| KR | 10-2018-0120547 A | 11/2018 |

OTHER PUBLICATIONS

Korean Office Action dated Jul. 22, 2022, in counterpart Korean Patent Application No. 10-2021-0059550 (7 pages in Korean).

*Primary Examiner* — Xiaoming Liu
(74) *Attorney, Agent, or Firm* — NSIP Law

(57) ABSTRACT

A manufacturing method of a semiconductor device, includes providing a substrate; forming a stacked gate, including a floating gate and a control gate, on the substrate; forming a stacked gate by a deposition of a select gate conductive layer on the stacked gate; forming a trench in the stacked gate by etching the stacked gate to separate a first select gate pattern and a second select gate pattern; and forming a first select gate, a second select gate, a first transistor, and a second transistor simultaneously through an etch-back process of the stacked gate.

17 Claims, 16 Drawing Sheets

(56) References Cited

U.S. PATENT DOCUMENTS

| | | |
|---|---|---|
| 8,541,277 B2 | 9/2013 | Jeong |
| 8,575,683 B1 * | 11/2013 | Shih ................. H01L 27/11521 |
| | | 257/306 |
| 8,722,488 B2 | 5/2014 | Shih |
| 8,884,352 B2 | 11/2014 | Shum et al. |
| 8,895,397 B1 | 11/2014 | Shum et al. |
| 9,153,704 B2 | 10/2015 | Kwon |
| 10,269,815 B2 | 4/2019 | Yang et al. |
| 2008/0197111 A1 * | 8/2008 | Jung ................. H01L 29/40117 |
| | | 216/74 |
| 2011/0096609 A1 * | 4/2011 | Lee ................... G11C 16/0483 |
| | | 257/E27.06 |
| 2015/0091073 A1 * | 4/2015 | Li ......................... H10B 43/35 |
| | | 257/316 |
| 2018/0145085 A1 * | 5/2018 | Liu .................. H01L 29/42328 |

\* cited by examiner

SEMICONDUCTOR DEVICE WITH NON-VOLATILE MEMORY CELL AND MANUFACTURING METHOD THEREOF

CROSS-REFERENCE TO RELATED APPLICATION

This application claims the benefit under 35 U.S.C. § 119 to Korean Patent Application No. 10-2021-0059550 filed on May 7, 2021, in the Korean Intellectual Property Office, the entire disclosure of which is incorporated herein by reference for all purposes.

BACKGROUND

1. Field

The following disclosure relates to a semiconductor device including non-volatile memory cell and manufacturing method thereof.

2. Description of Related Art

A non-volatile memory device is used in various application fields such as Controller IC, RFID (Radio Frequency Identification) Tag, MCU (Microcontroller Unit), Touch, etc., because data saved in a memory cell are not lost even if power is down, and it is growing in importance. Typical semiconductor devices, including non-volatile memory cells, are FLASH memory devices and EEPROMs (Electrical Erasable Programmable Read Only Memory).

In a manufacturing method of a semiconductor device, including a traditional flash memory cell, a mask is used when forming an access transistor to prevent cell leakage, leading to a feature difference between a left cell and a right. Due to mismatching caused by such feature differences, there is a limit in shrinking the minimum gate length of an access transistor.

Moreover, in manufacturing a semiconductor device, including a traditional flash memory cell, a photo resistor has to be thick in the case of etching a floating gate polysilicon, ONO (Oxide/Nitride/Oxide) layer, control gate polysilicon, etc. using a photo resistor. Furthermore, because a thick photo resistor had to be used, there is also difficulty shrinking the space between polysilicon layers of the floating gate.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, a manufacturing method of a semiconductor device, includes providing a substrate; forming a stacked gate, including a floating gate and a control gate, on the substrate; forming a stacked gate by a deposition of a select gate conductive layer on the stacked gate; forming a trench in the stacked gate by etching the stacked gate to separate a first select gate pattern and a second select gate pattern; and forming a first select gate, a second select gate, a first transistor, and a second transistor simultaneously through an etch-back process of the stacked gate.

The providing of the substrate may include forming a deep N-type well region in the substrate, forming a P-type well region on the deep N-type well region, and forming a thin gate insulating layer on the P-type well region.

The trench may be formed by forming a mask pattern on the select gate conductive layer, exposing the stacked gate by etching a portion of the select gate conductive layer that is formed at an upper side of the stacked gate, using the mask pattern, and etching the exposed stacked gate.

The manufacturing method may further include forming a first insulating film spacer and a second insulating film spacer on each of a side wall of the first transistor and a side wall of the second transistor, forming drain regions under the first insulating film spacer and the second insulating film spacer, forming source regions between the first transistor and the second select gate, and forming silicide layers on the substrate, the first transistor, and the second transistor.

The manufacturing method may further include forming an etch stop layer on the silicide, forming an inter-layer insulating film on the etch stop layer, forming contact plugs connected to the drain region and the source region by etching the inter-layer insulating film using the etch stop layer, and forming metal wirings connected to the contact plug.

The stacked gate may further include a dielectric layer between the floating gate and the control gate.

The dielectric layer may be exposed through the trench.

The floating gate may be exposed through the trench.

The manufacturing method may further include a first split gate and the second split gate may be formed by etching the floating gate exposed through the etch-back process.

A height of each of the first select gate and the second select gate may be lower than maximum height of the control gate with respect to a surface of the substrate, and the first select gate and the second select gate may be respectively formed as a spacer at one side of each of the first transistor and the second transistor.

In another general aspect, a manufacturing method of a semiconductor device, includes providing a substrate; forming a stacked gate, comprising a floating gate and a control gate, on the substrate; depositing a select gate conductive layer on the stacked gate; forming a first stack pattern and a second stack pattern by etching an intermediate portion of the select gate conductive layer and the stacked gate; and simultaneously forming a first select gate and a second select gate by an etch-back process of the select gate conductive layer remaining in the stacked gate. A first transistor and a second transistor are formed between the first and the second select gate.

The first stack pattern and the second stack pattern may be formed on the floating gate conductive layer.

The forming of the stacked gate may include forming the floating gate on the substrate; forming a dielectric layer on the floating gate conductive layer; forming the control gate on the dielectric layer; depositing an a hard mask layer on the control gate; and forming the stacked gate by patterning the insulating film for the hard mask, the control gate, the dielectric layer, and the floating gate conductive layer.

A portion of the select gate conductive layer deposited at an upper side of the stacked gate may be etched to expose an intermediate portion of the stacked gate. A portion of the select gate conductive layer may remain at a side and an upper side of the stacked gate during formation of a first stack pattern and a second stack pattern by the etching of the intermediate portion of the stacked gate.

The select gate conductive layer remaining at opposite sides and an upper side of the stacked gate may be etched through the etch-back process, and the first select gate and the second select gate may be formed as spacers at a side of the first transistor and a side of the second transistor, respectively.

The manufacturing method may further include forming drain regions between the first stacked gate and the second stacked gate, and forming a first source region and a second source region below the first select gate and the second select gate, respectively.

In another general aspect, a semiconductor device includes a substrate; stacked gates, each comprising a floating gate and a control gate, disposed on the substrate; select gates, each disposed on opposing sides of adjacent ones of the stacked gates; and contact plugs, each disposed between the adjacent ones of the stacked gates. The select gates are symmetrically formed and disposed about the contact plugs.

The semiconductor device may further include a deep N-type well region disposed in the substrate, a P-type well region disposed on the deep N-type well region, and thin gate insulating layers disposed between the floating gate and the P-type well region.

The semiconductor device may further include a first insulating film spacer and a second insulating film spacer disposed on a sidewall of the transistors; drain regions, each disposed under the first insulating film spacer and the second insulating film spacer; and source regions disposed between the adjacent ones of the stacked gates.

Each of the stacked gates may further include a dielectric layer between the floating gate and the control gate.

Other features and aspects will be apparent from the following detailed description, the drawings, and the claims.

BRIEF DESCRIPTION OF THE DRAWINGS

Throughout the drawings and the detailed description, the same reference numerals refer to the same elements. Drawings may not be to scale, and the relative size, proportions, and depiction of elements in the drawings may be exaggerated for clarity, illustration, and convenience.

DETAILED DESCRIPTION

Figure 1:
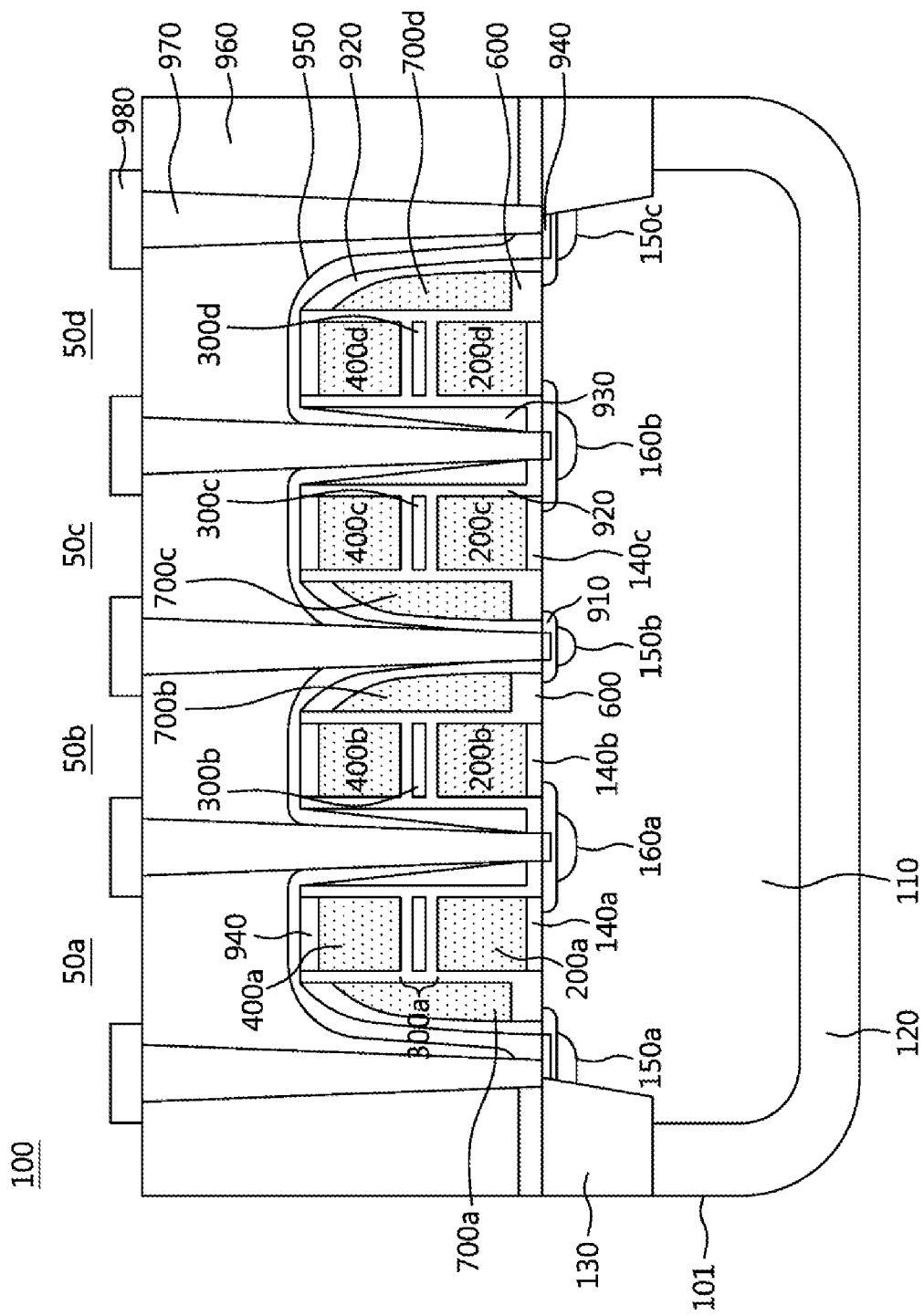
FIG. 1 is a cross-sectional view of a semiconductor device, including non-volatile memory cells according to an embodiment of the disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways, as will be apparent after an understanding of the disclosure of this application. Further, although the examples described herein have a variety of configurations, other configurations are possible, as will be apparent after an understanding of the disclosure of this application.

The disclosure is to solve the above problems, providing a manufacturing method of a semiconductor device including a flash memory cell that is easy to shrink an access transistor, by symmetrically forming a gate polysilicon of each access transistor, and providing a semiconductor device including non-volatile memory cell according to the method.

A targeted problem of the disclosure is not limited by the problems mentioned above. A person skilled in the relevant field of technology may understand other problems from the following description.

A detailed description of the disclosure is given below, according to the attached drawings.

FIG. 1 is a cross-sectional view of a semiconductor device, including a non-volatile memory cell, according to an embodiment of the disclosure.

With reference to FIG. 1, a semiconductor device 100 including non-volatile memory cell, according to an embodiment of the disclosure, may include a plurality of transistors 50a, 50b, 50c and 50d on a substrate 101 where a P-type well region 110 and a deep N-type well region 120 are placed.

Herein, each of the transistors 50a, 50b, 50c and 50d may include a thin gate insulating layer 140a, 140b, 140c, 140d, a floating gate 200a, 200b, 200c and 200d, a dielectric layer 300a, 300b, 300c and 300d, a control gate 400a, 400b, 400c and 400d, a thick gate insulating layer 600 and a select gate 700a, 700b, 700c and 700d.

The thin gate insulating layer 140a, 140b, 140c, 140d, the floating gate 200a, 200b, 200c and 200d, the dielectric layer 300a, 300b, 300c and 300d, and the control gate 400a, 400b, 400c and 400d are stacked together. The stacked structure may be called as a stacked gate. The stacked gate may comprise at least the floating gate 200a, 200b, 200c and 200d, the dielectric layer 300a, 300b, 300c and 300d, and the control gate 400a, 400b, 400c and 400d.

Select gates 700a, 700b, 700c and 700d, each is disposed on opposing sides of adjacent ones of the stacked gates. Select gates 700a, 700b, 700c and 700d are respectively formed in the transistors 50a, 50b, 50c and 50d. For example, a first select gate 700a is formed on sidewalls of a first floating gate 200a and a first control gate 400b. A second select gate 700b is formed on sidewalls of a second floating gate 200b and a second control gate 400b.

Dielectric layers 300a, 300b, 300c, 300d may comprise a silicon nitride layer or an ONO (Oxide/Nitride/Oxide) layer. Thin gate insulating layers 140a, 140b, 140c, 140d may be formed between a floating gate 200a, 200b, 200c and 200d and a substrate 101. Thick gate insulating layers 600 may be formed between the select gate 700a, 700b, 700c and 700d and a substrate 101. A deep N-type well region 120, a P-type well region 110, and shallow trench isolations (STI) 130 may be formed in a substrate 101.

Source regions 150a, 150b and 150c may be formed adjacent to the select gates 700a, 700b, 700c and 700d. Additionally, common drain regions 160a and 160b may be formed between the thin gate insulating layers 140a, 140b, 140c and 140d. Lightly doped drain (LDD) regions 910 may be formed in the source regions 150a, 150b and 150c and the drain regions 160a and 160b. Spacers 920 and 930 may be formed on the source regions 150 and the drain regions 160a and 160b. Silicide layers 940 may be formed on the control gates 400, the source regions 150 and the drain regions 160. An etch stop layer 950 and an inter-layer insulating film 960 may be formed on the transistors 50a, 50b, 50c and 50d. A plurality of contact plugs 970 are electrically connected with the drain regions 160a and 160b and the source regions 150a, 150b and 150c. A plurality of metal wirings 980 are electrically connected to a plurality of contact plugs 970.

When forming the select gates 700a, 700b, 700c and 700d for access transistors, the select gates 700a, 700b, 700c and 700d are symmetrically formed with the same length because an etch-back process is performed without a mask. Thus, with a semiconductor device including a non-volatile memory cell, according to an embodiment of the disclosure, it is easier to shrink an access transistor because each of the select gates 700a, 700b, 700c and 700d for access transistors is symmetrically formed with the same length, and electrical performance may be substantially identical.

The description below describes a process for a manufacturing method of a semiconductor device, including a non-volatile memory cell according to an embodiment of the disclosure in further detail.

FIG. 2A to FIG. 10B are diagrams of a manufacturing method of a semiconductor device, including a non-volatile memory cell according to an embodiment of the disclosure.

Figure 2A:
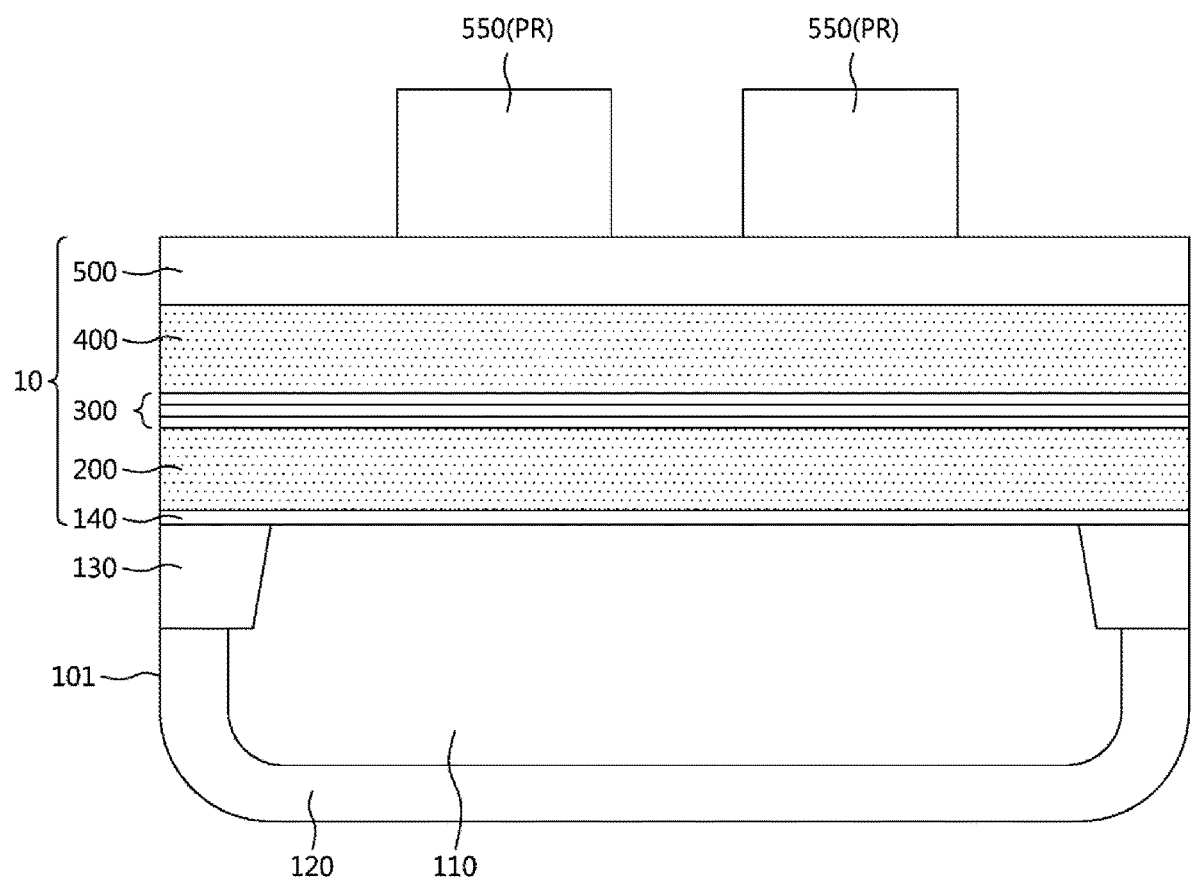
FIG. 2A to FIG. 10B are diagrams of a manufacturing method of a semiconductor device including non-volatile memory cell according to an embodiment of the disclosure.

FIG. 2A describes an operation of providing a substrate and forming a stacked gate layer, including a floating gate and a control gate on the substrate.

An operation of providing a substrate may include forming a deep N-type well region 120 in a substrate 101, forming a P-type well region 110 on the deep N-type well region 120, and forming a plurality of STI (Shallow trench isolation) 130 in the substrate 101.

Herein, the substrate 101 may include a semiconductor material. It may be a silicon (Si) substrate, gallium-arsenic (GaAs) substrate, indium phosphide (InP) substrate, germanium (Ge) substrate, or silicon germanium (SiGe) substrate. In an embodiment, the substrate 101 may be doped and have conductivity and doped by an N-type or P-type dopant. Further, the substrate 101 may include a well region doped by an N-type or P-type dopant inside the substrate. Herein, the STI (Shallow trench isolation) 130 may be formed as an isolation insulating layer at opposite ends on the substrate 101.

Additionally, forming a stacked gate layer 10, including a floating gate conductive layer 200 and a control gate conductive layer 400 on the substrate may involve the following operations: forming a thin gate insulating layer 140 on the substrate 101; and depositing a floating gate conductive layer 200, a dielectric layer 300, a control gate conductive layer 400, and a hard mask layer 500 in order. A dielectric layer 300 may be an insulating film that forms a silicon oxide layer, a silicon nitride layer, and a silicon oxide layer in order.

Thus, a stacked gate layer 10 formed on a substrate 101 may include a thin gate insulating layer 140, a floating gate conductive layer 200, a dielectric layer 300, a control gate conductive layer 400, and a hard mask layer 500. A stacked gate layer 10 may be patterned using a photoresist pattern (PR) 550 formed in the stacked gate layer 10. Herein, a floating gate conductive layer 200 and a control gate conductive layer 400 may be formed using polysilicon.

Figure 2B:
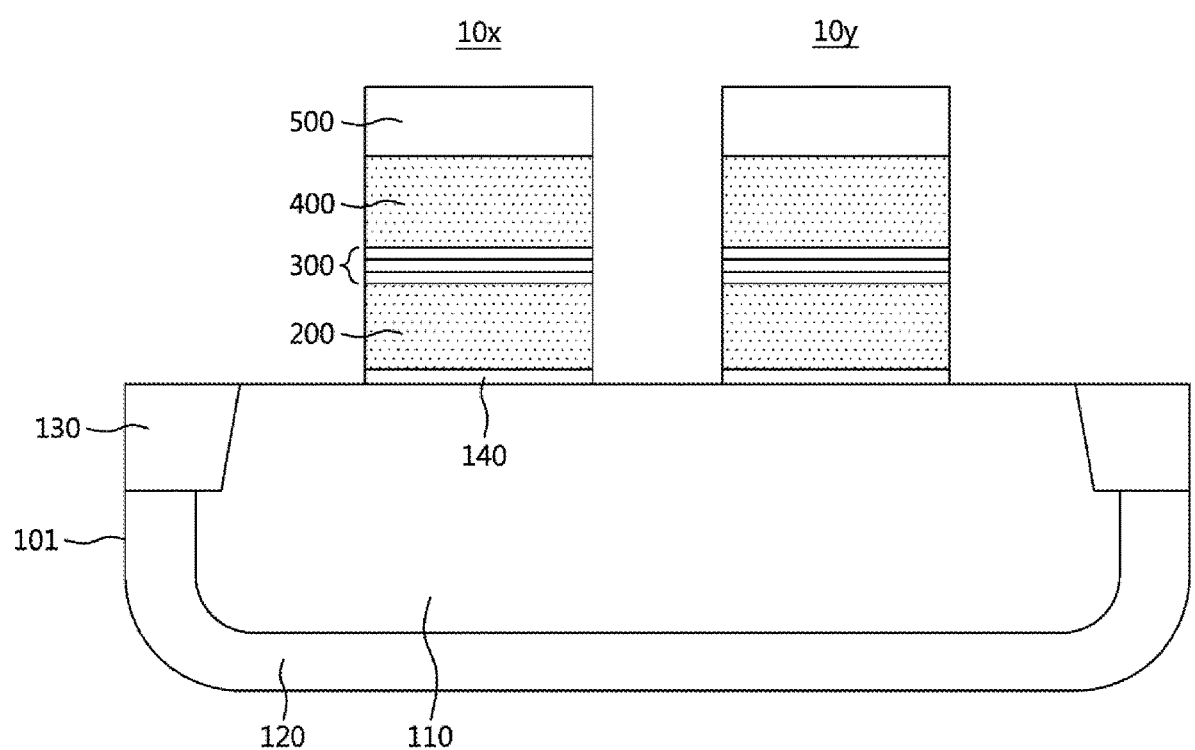

FIG. 2B describes a formation of a stacked gate on the substrate, including a floating gate and a control gate.

First and second stacked gates 10x and 10y may be formed by etching a stacked gate layer 10 with a photoresist pattern (PR) 550 used as a mask. Each stacked gate 10x and 10y may respectively include a thin gate insulating layer 140, a floating gate 200, a dielectric layer 300, a control gate 400, and a hard mask layer 500. The rest of the photoresist pattern (PR) 550 that remains after etching may be removed through plasma ashing.

Figure 3:
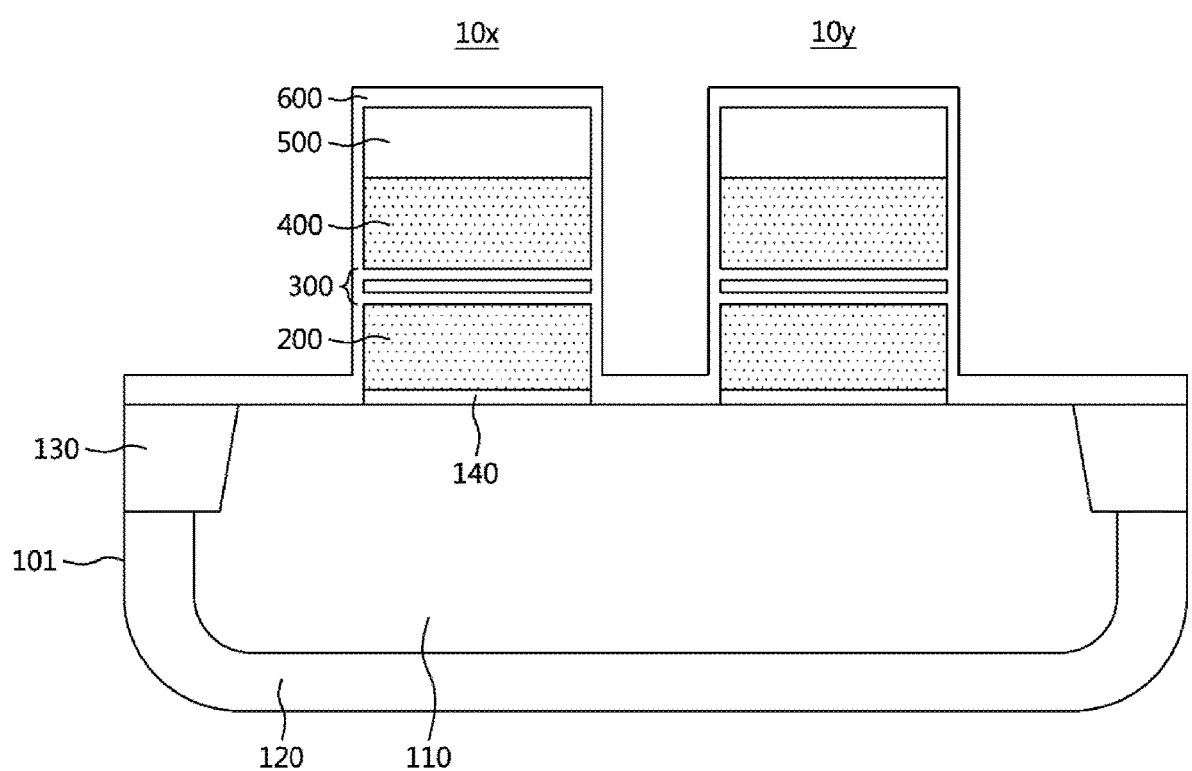

FIG. 3 describes an operation of forming a thick gate insulating layer on the stacked gate.

FIG. 3 shows that a thick gate insulating layer 600 is formed on the first and second stacked gates 10x and 10y. Herein, it may be desirable to form the thick gate insulating layer 600 through thermal oxidation or CVD method, but it is not limited thereto. The thick gate insulating layer 600 is used as a select gate insulating layer.

Figure 4:
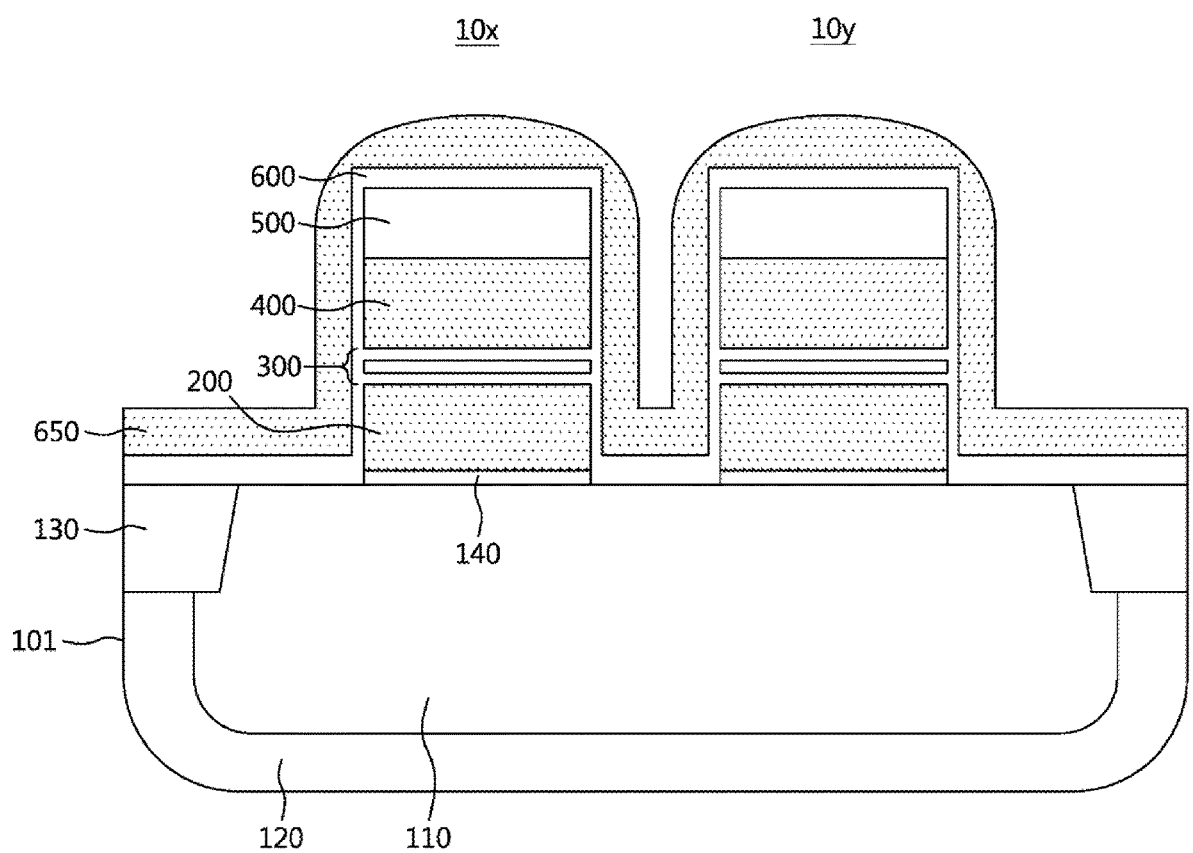

FIG. 4 describes a formation of a stacked gate where the floating gate conductive layer, the control gate, and the select gate conductive layer stacked on the substrate by depositing the select gate conductive layer on the stacked gate.

With reference to FIG. 4, a single select gate conductive layer 650 may be formed on the thick gate insulating layer 600. A single select gate conductive layer 650 may be formed using a polysilicon material by CVD. Herein, by depositing a select gate conductive layer 650 on a first and second stacked gate 10x and 10y, a first stacked gate 10x and a second stacked gate 10y may be respectively formed. Each of the first stacked gate 10x and the second stacked gate 10y may comprise a thin gate insulating layer 140, a floating gate 200, a dielectric layer 300, a control gate 400, a hard mask layer 500, a thick gate insulating layer 600, and a select gate conductive layer 650.

Figure 5:
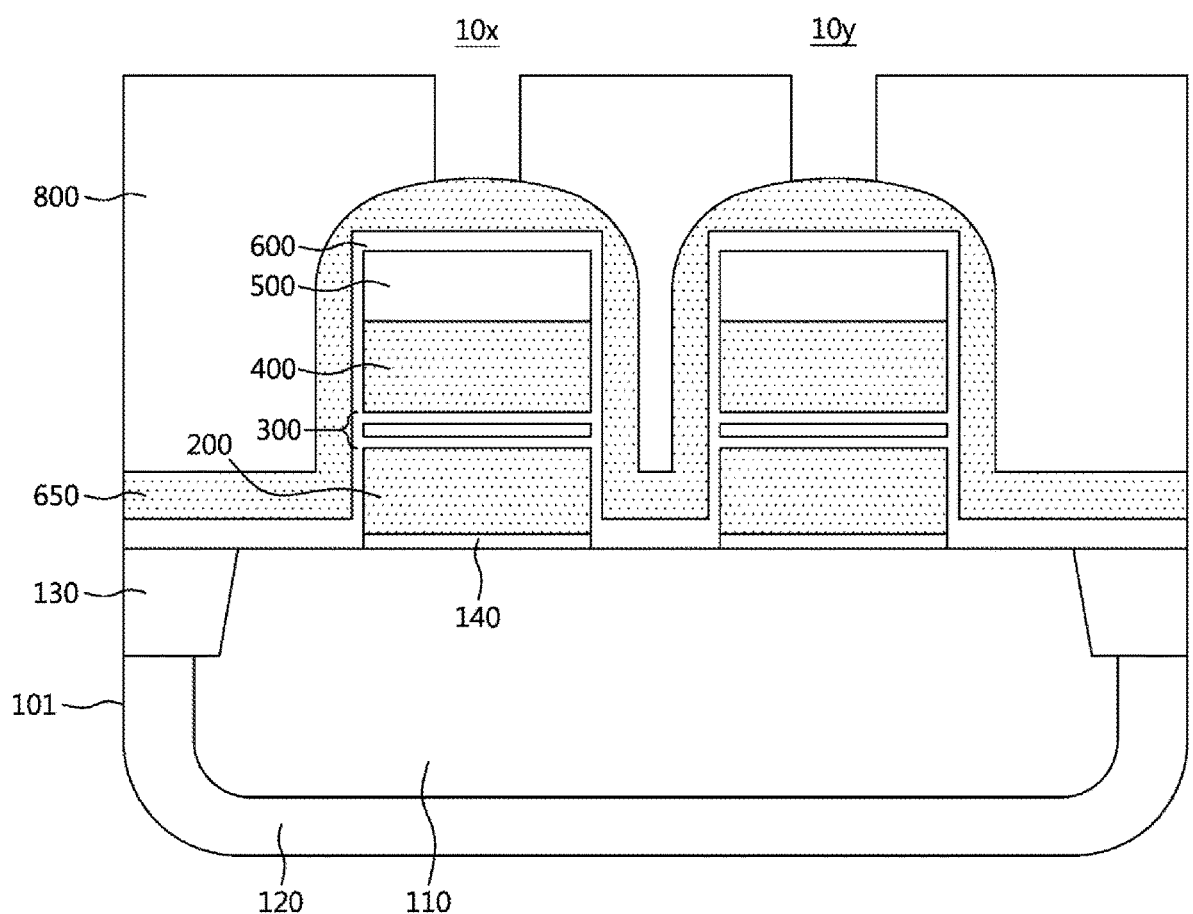

FIG. 5 describes a photolithography stage to form a trench by etching a stacked gate.

With reference to FIG. 5, a photoresist pattern 800 may be formed in the stacked gates 10x and 10y. That is, a photoresist pattern 800 may be formed on the select gate conductive layer 650. The photoresist pattern 800 is used as a mask to form a trench in each of the stacked gates 10x and 10y.

Figure 6A:
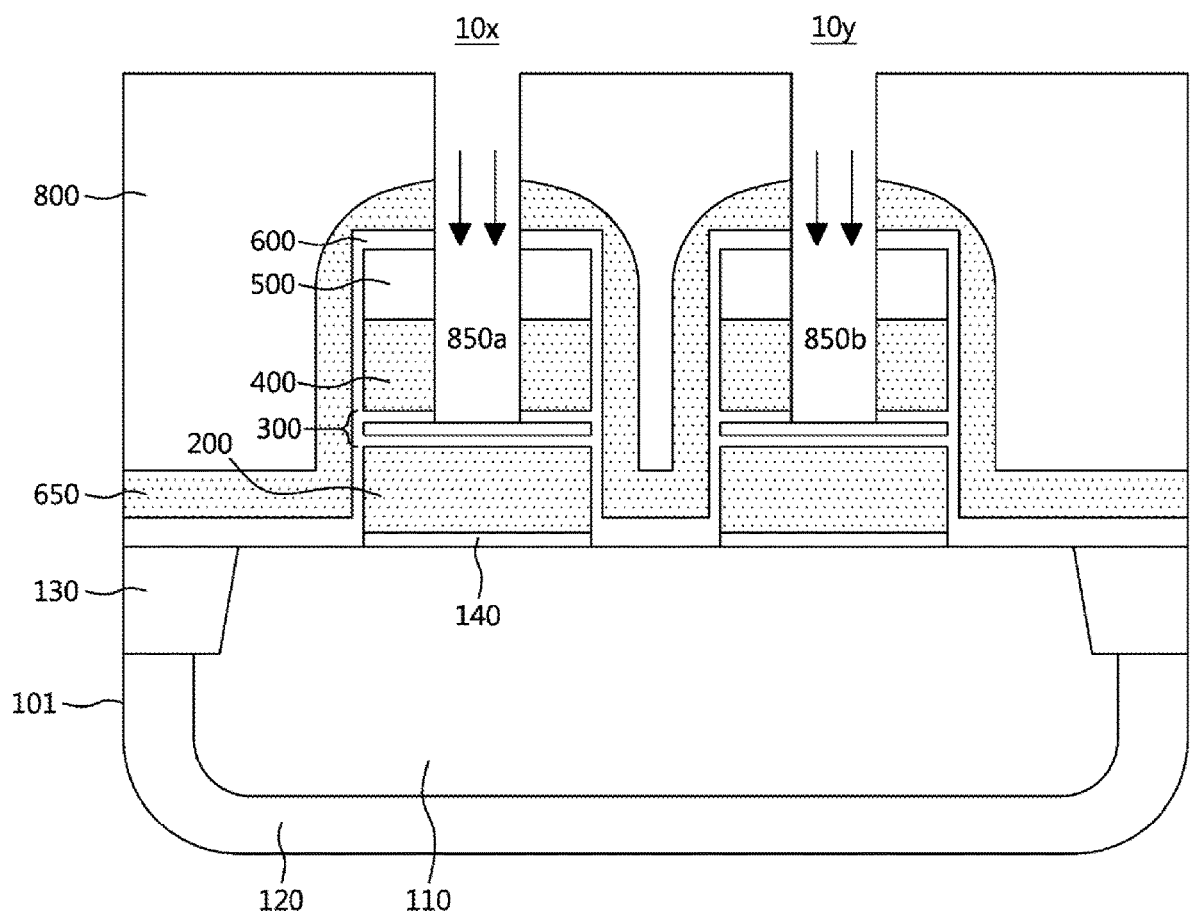
Figure 6B:
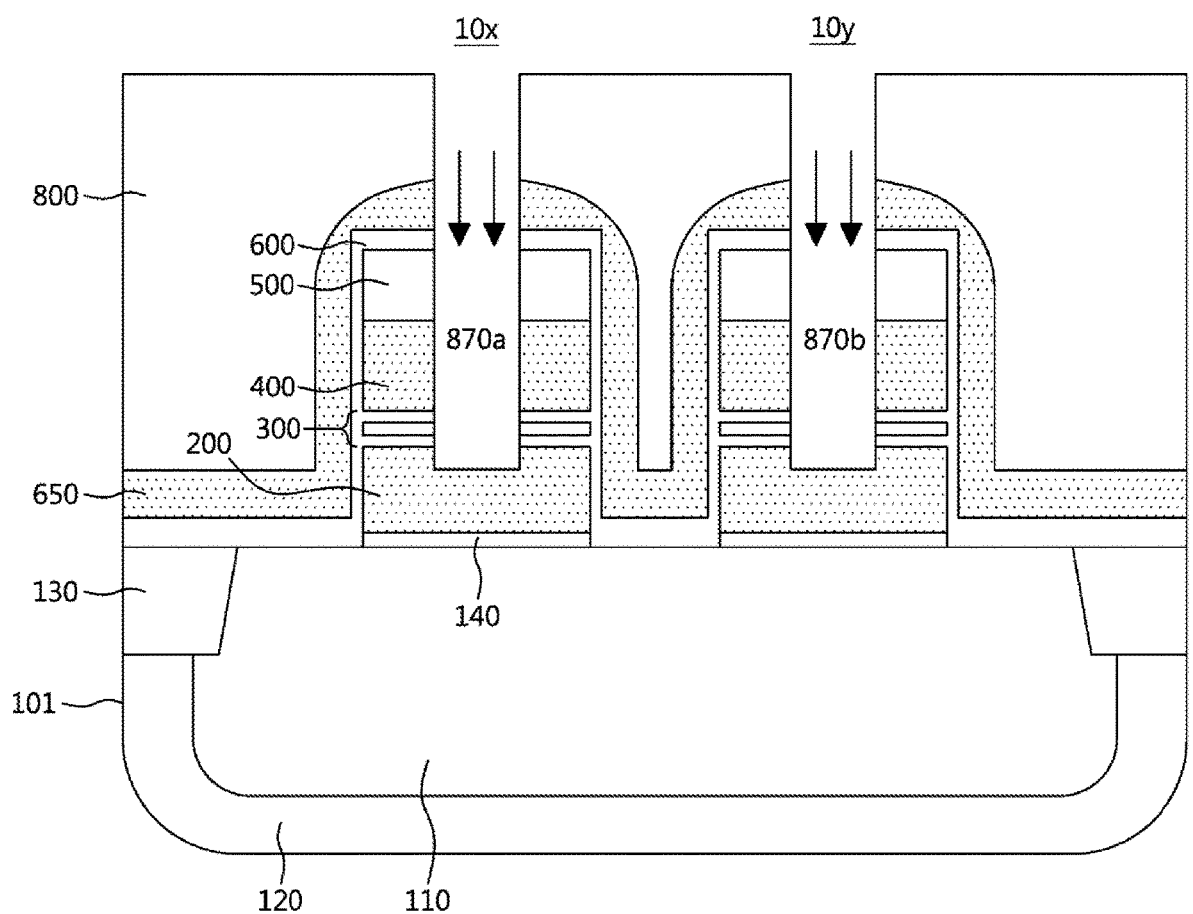

FIGS. 6A and 6B describe performing a first etching the select gate conductive layer and the control gate to form a trench in the stacked gate.

Depending on the etching conditions, the first etching may be FIG. 6A or FIG. 6B. Different etch stop points are shown in FIGS. 6A and 6B.

First, with reference to FIG. 6A, a select gate conductive layer 650, a thick gate insulating layer 600, a hard mask layer 500 and the control gate 400 are sequentially etched using a photoresist pattern 800. First and second trenches 850a and 850b may be respectively formed in the first and second stacked gates 10x and 10y, by etching the first and second stacked gates 10x and 10y. Two hard mask layers 500 are divided into four hard mask layers 500. Likewise, two control gates 400 are divided into four control gates through an etching process. The four hard mask layers 500 and four control gates 400, each side surface adjacent to the trenches 850a and 850b is exposed.

The first etching process may be stopped at a dielectric layer 300. The first etching process may be stopped at either of a silicon oxide layer (top), a silicon nitride layer (middle), or a silicon oxide layer (bottom) in the dielectric layer 300. Most cases, the silicon nitride layer (middle) may be used as an etch stop layer. If the etch-back process is further carried out extensively, it may be beneficial to stop forming a trench at a dielectric layer, as illustrated in FIG. 6A.

FIG. 6B shows another example for forming a trench. With reference to FIG. 6B, etching may be stopped at a floating gate 200 when forming trenches 870a and 870b. The rest of the parts are similar to FIG. 6A. If the etch-back process is further carried out lightly, it may be beneficial to stop etching at a floating gate 200.

Figure 7A:
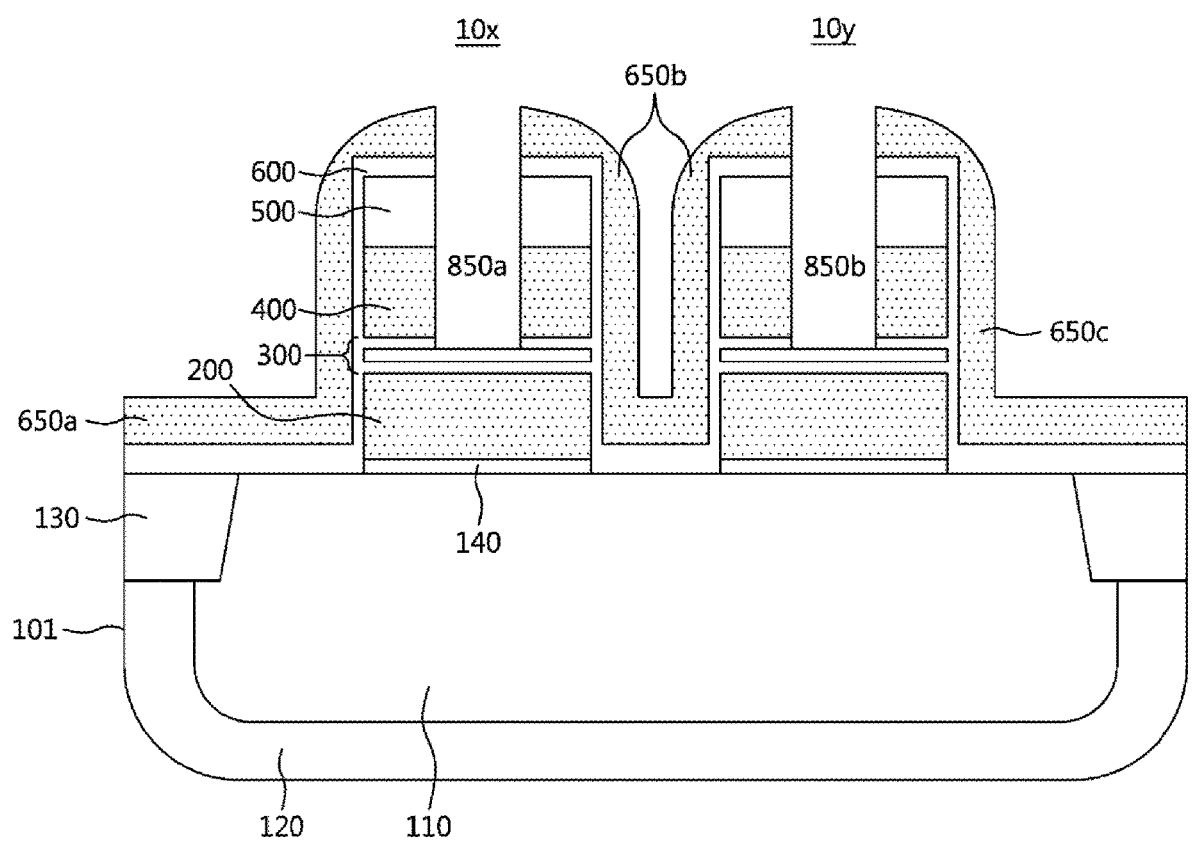
Figure 7B:
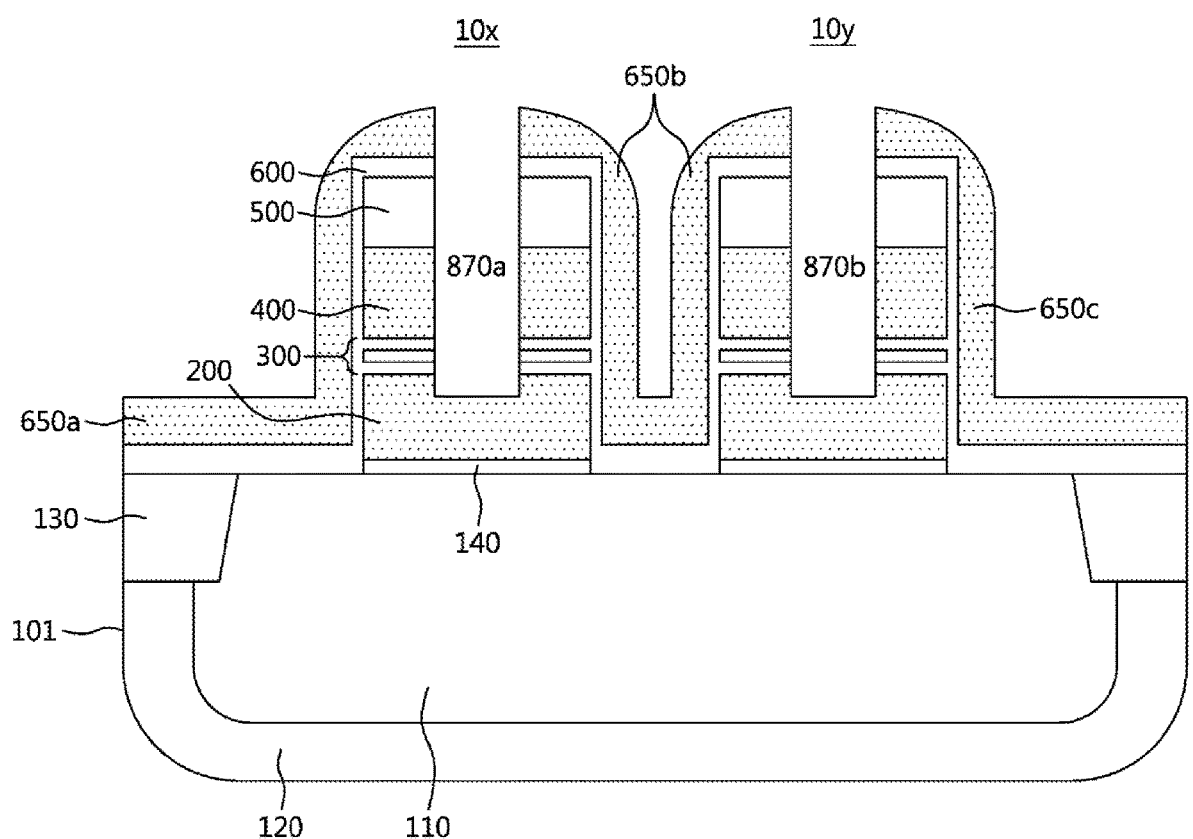

FIGS. 7A and 7B show the removal of photoresist pattern.

FIGS. 7A and 7B show that a plurality of the patterned conductive layers 650a, 650b and 650c may be formed, and they are separated by the trenches 850a and 850b. For example, at least three patterned conductive layers 650a, 650b and 650c, are remained at a side and an upper side of the first and second stacked gates 10x and 10y. A second patterned conductive layer 650b is formed across the first and second stacked gates 10x and 10y. First and third patterned conductive layers 650a and 650c are formed on the first and second stacked gates 10x and 10y, respectively. The remained three patterned conductive layers 650a, 650b and 650c may be converted into separated select gates 700a, 700b, 700c and 700d by the etch-back process (See FIG. 8). An additional etching process, such as the etch-back process, may be needed to form a select gate as a spacer shape.

Figure 8:
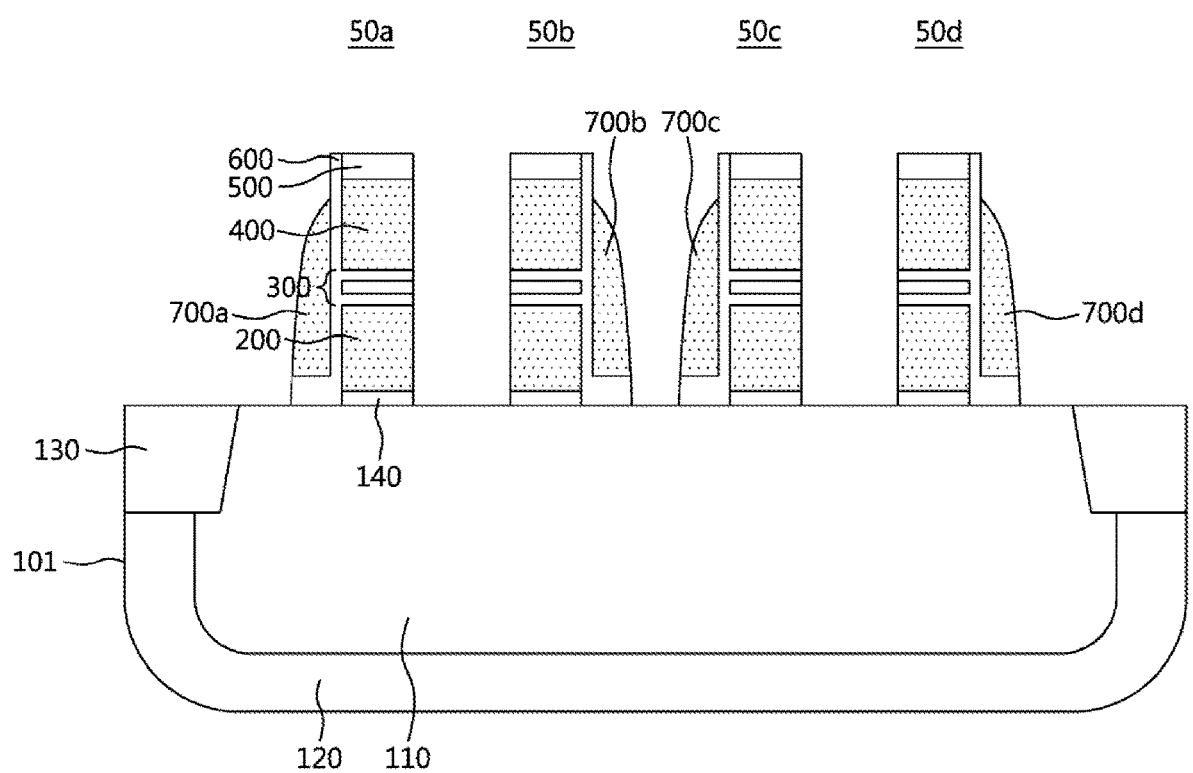

FIG. 8 illustrates performing an etch-back process on the remaining select gate conductive layer and the floating gate to separate the stacked gate, thereby simultaneously forming a plurality of transistors.

With reference to FIG. 8, in a method of the disclosure of manufacturing a semiconductor device including a flash memory cell, an etch-back process may be carried out. In a method of the disclosure of manufacturing a semiconductor device including a flash memory cell, select gates 700a, 700b, 700c and 700d may be formed from the three patterned conductive layers 650a, 650b and 650c by executing a blanket etch-back process. For example, the first patterned conductive layer 650a is converted into a first select gate 700a. Likewise, the second patterned conductive layer 650b is divided into a second select gate 700b and a third select gate 700c by the etch-back process. Further, the third patterned conductive layer 650c is converted into a fourth select gate 700d. A height of each of the first select gate 700a and the second select gate 700b is lower than maximum height of each of the control gates 400 with respect to a top surface of the substrate 101.

Select gates 700a, 700b, 700c and 700d may be formed as a spacer at a sidewall of a transistor 50a-50d. Depending on the conditions of the etch-back process, select gates 700a, 700b, 700c and 700d formed at a sidewall of the transistor 50a-50d may be designed with appropriate thickness and structure. During the etch-back process, the thin gate insulating layer 140 plays a role of an etch stop layer. Thus, the thin gate insulating layer 140 may be remained on a top surface of the substrate 101 (not shown). Further, a cleaning process may be additionally performed to remove polysilicon residues, which are byproducts of the etch-back process. The cleaning process may also remove the remaining thin gate insulating layer 140, so the top surface of the substrate 101 may be exposed.

Moreover, in a method of the disclosure manufacturing a semiconductor device including a flash memory cell, an etch-back process is executed without a mask when forming an access transistor. Thus, select gates 700a, 700b, 700c and 700d for access transistors may be symmetrically formed with the same length.

A dielectric layer 300 or a floating gate 200 that remains in a stacked gate 10x and 10y may be etched through an etch-back process. Herein, with a formation of trench 850 by etching a dielectric layer 300 and a floating gate 200, a thin gate insulating layer 140 may be exposed.

Eventually, select gates 700a, 700b, 700c and 700d and 4 transistors 50a, 50b, 50c and 50d may be formed simultaneously from the two stacked gates 10x and 10y. Herein, a transistor 50a, 50b, 50c and 50d may include a floating gate electrode (FG, 200), a dielectric layer 300, and a control gate electrode (CG, 400).

Figure 9A:
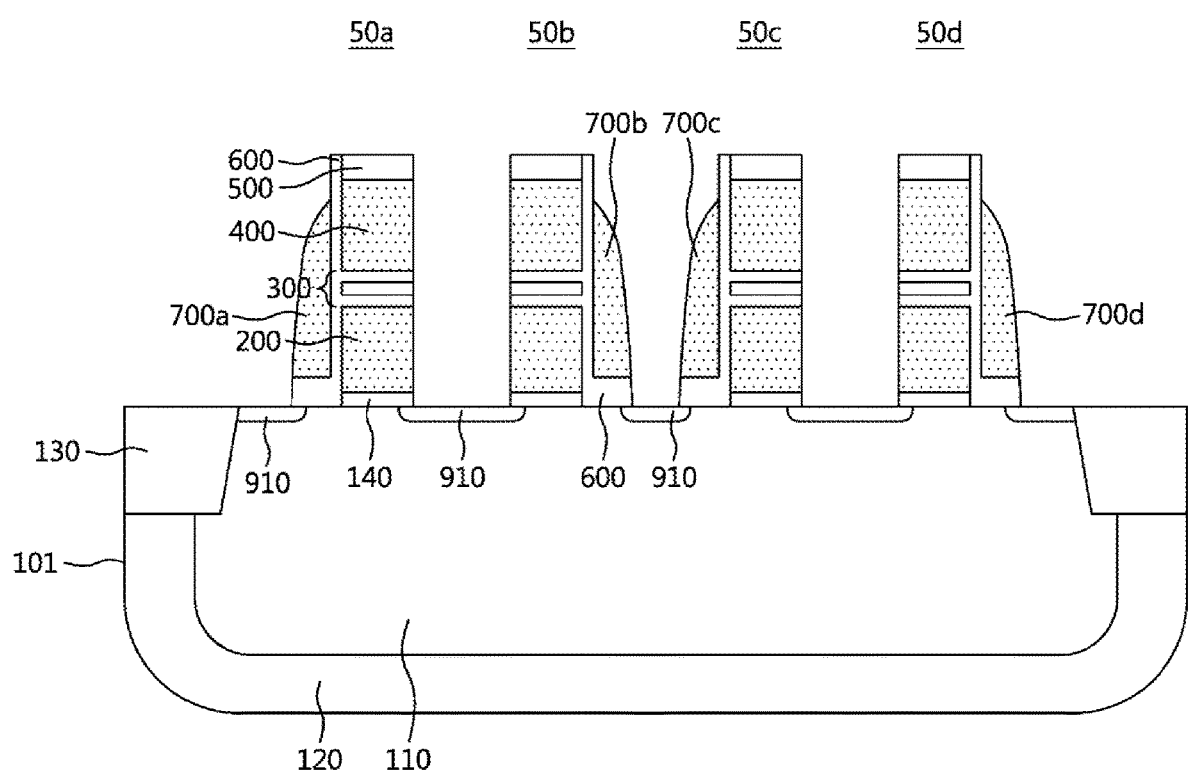

FIG. 9A shows an operation of forming lightly doped drain (LDD) regions in a substrate.

With reference to FIG. 9A, ion implantation may be executed to form LDD regions 910 in a substrate 101.

Figure 9B:
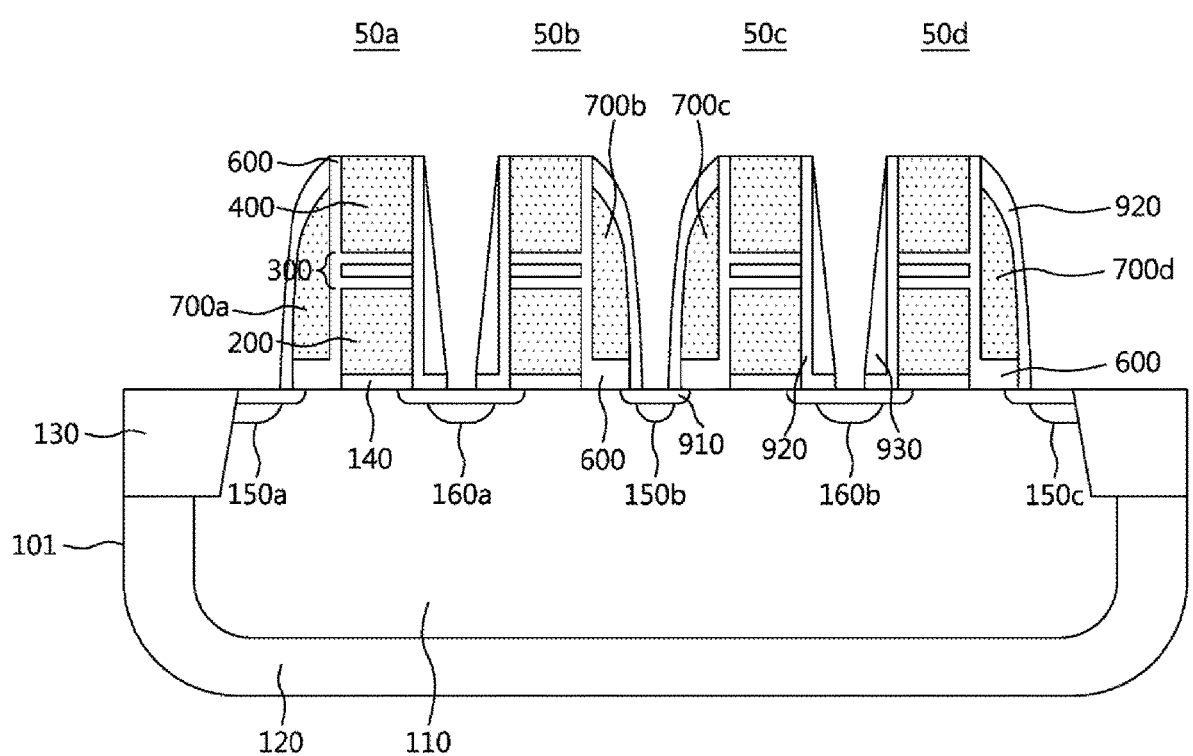

FIG. 9B describes the formation of an insulating film spacer at a sidewall of a transistor.

With reference to FIG. 9B, a first insulating film spacer 920 and a second insulating film spacer 930 may be formed at a sidewall of a transistor 50a-50d. A silicon oxide layer 920 and a silicon nitride layer 930 may be used as a material of spacers 920 and 930. In forming the spacers 920 and 930, a hard mask layer 500 may be removed, and a top surface of the control gate electrode 400 may be exposed.

As shown in FIG. 9B, a thin gate insulating layer 140, a floating gate (FG) 200, a dielectric layer 300 and a control gate (CG) 400 directly contact both the thick gate insulating layer 600 and the first insulating film spacer 920. Select gates are formed on the thick gate insulating layer 600, and the second insulating film spacer 930 is formed on the first insulating film spacer 920.

Further, source regions 150a, 150b and 150c and drain regions 160a and 160b may be formed through ion implantation in the P-type well region after the etch-back process. The source regions 150a, 150b and 150c, and the drain regions 160a and 160b may be a region of a substrate doped as N-type or P-type. In case a substrate is doped as N-type or P-type, the source regions 150a, 150b and 150c and the drain regions 160a and 160b may be a region doped as a dopant that is opposite to a type of a substrate, but it is not limited thereto. The source regions 150a, 150b and 150c are formed adjacent to the select gates 700a, 700b, 700c and 700d. Drain regions 160a and 160b, each is disposed under the first insulating film spacer 920 and the second insulating film spacer 930.

Figure 9C:
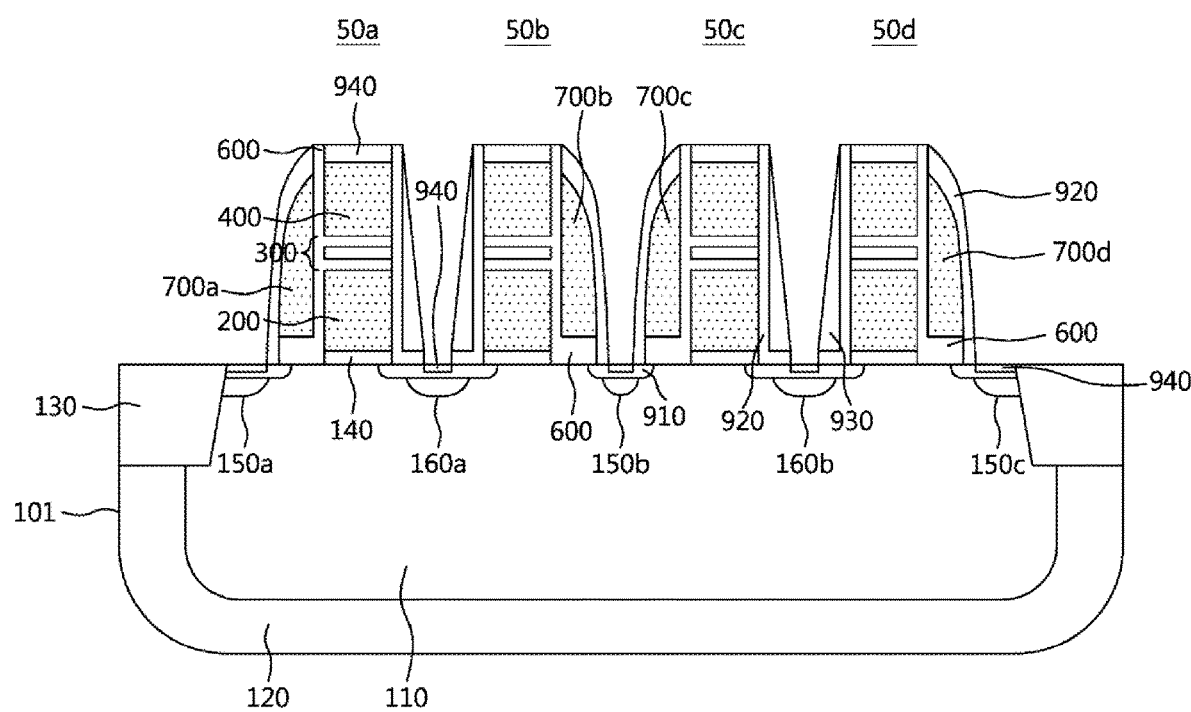

FIG. 9C illustrates an operation of forming silicide layers on the substrate.

With reference to FIG. 9C, in a method of the disclosure manufacturing a semiconductor device including a flash memory cell, silicide layers 940 may be formed on the source regions 150a, 150b and 150c, and the drain regions 160a and 160b. Another silicide layers 940 are also formed on the control gates 400 of the first to fourth transistor 50a-50d.

Figure 10A:
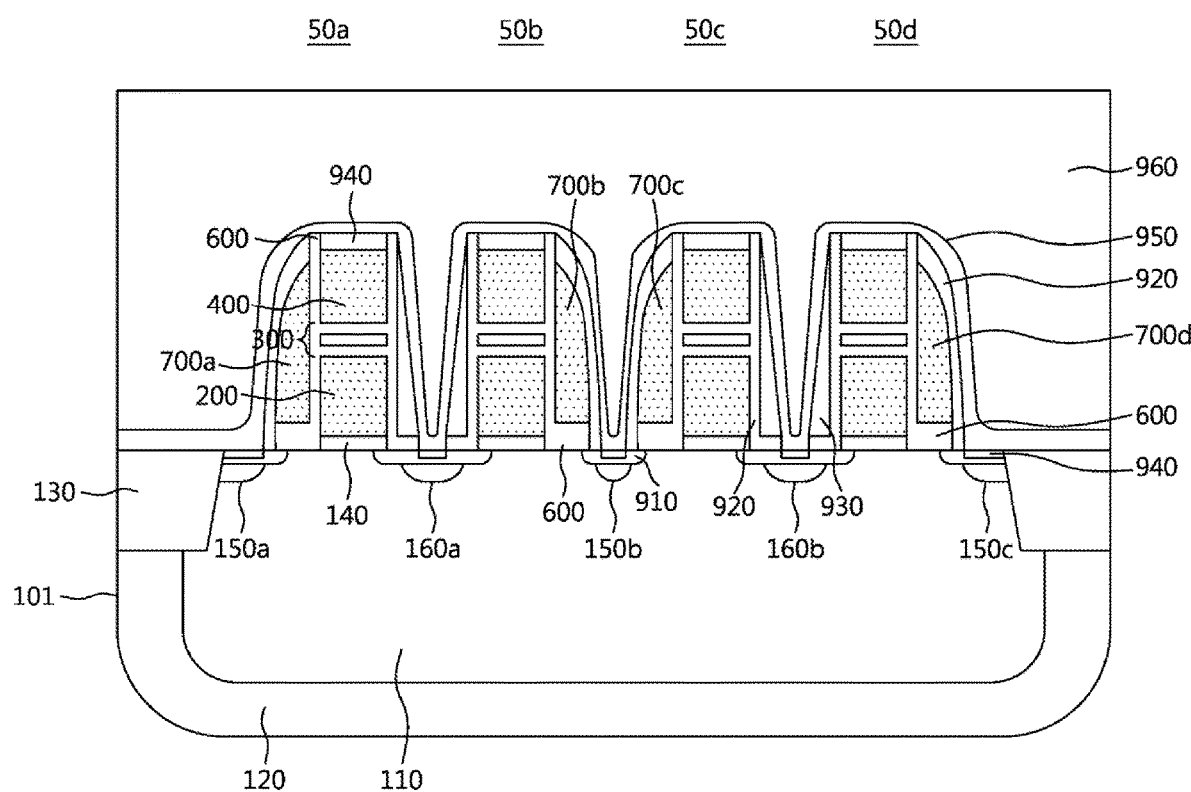

FIG. 10A illustrates a formation operation of an etch stop layer and an inter-layer insulating film 960.

As shown in FIG. 10A, a thin etch stop layer 950 is formed on the substrate 101. The etch stop layer 950 directly contacts the silicide layers 940 and the second insulating film spacer 930. The thin etch stop layer 950 may be selected from one of a SiON, SiN or SiO2. The etch stop layer 950 is used for borderless contact (BLC) hole, wherein a contact plug is formed in the borderless contact (BLC) hole. Additionally, a thick inter-layer insulating film 960 is formed on the etch stop layer 950.

Figure 10B:
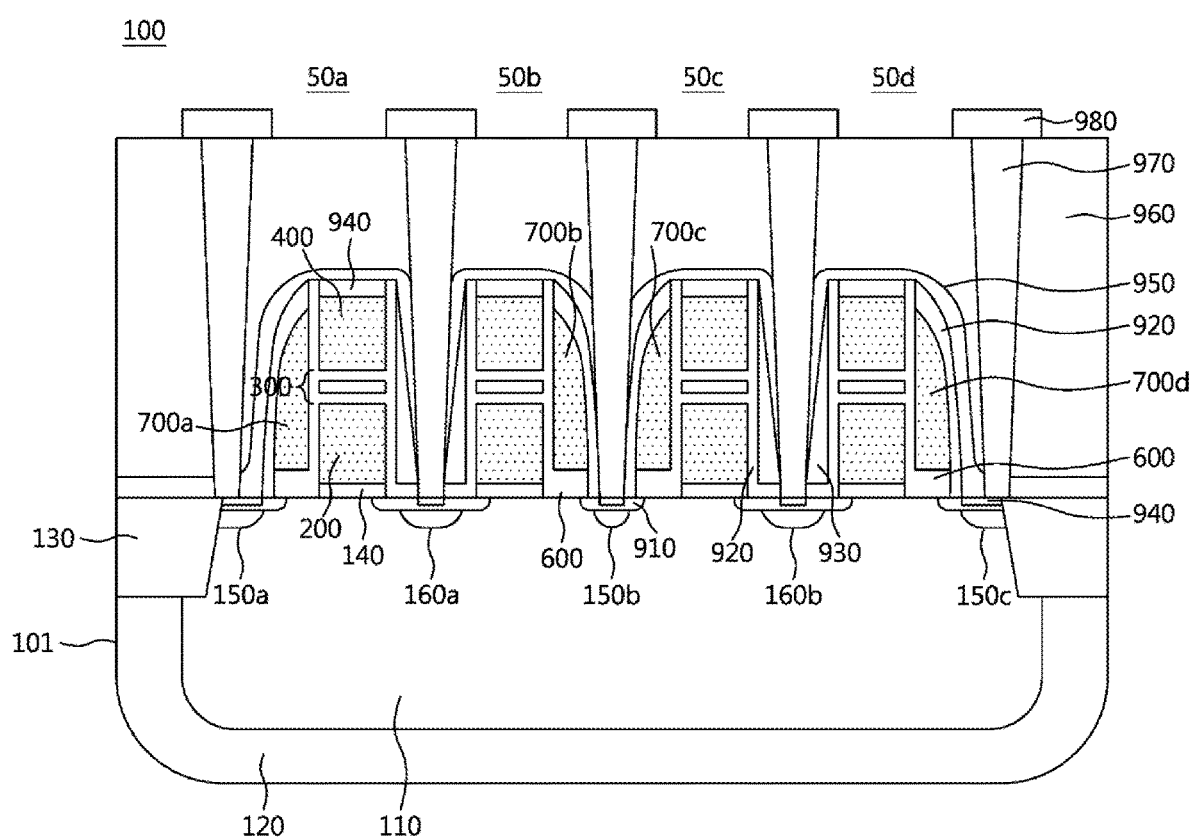

FIG. 10B shows an operation of forming contact plugs 970 that are electrically connected to the drain regions 160 and the source regions 150 through etching the inter-layer insulating film 960, using the etch stop layer 950; and metal wirings 980 that are electrically connected to the contact plugs 970.

According to the disclosure, the gate polysilicon of each access transistor is symmetrically formed by an improved process, making it significantly easier to shrink an access transistor.

Meanwhile, this specification additionally discloses a semiconductor device, including a non-volatile memory cell, produced by the manufacturing method of a semiconductor device, including a flash memory cell.

A semiconductor device 100 including a non-volatile memory cell, produced by the manufacturing method of a semiconductor device including a flash memory cell, may include consistently spaced a plurality of transistors 50a, 50b, 50c and 50d on a substrate 101 where a P-type well region 110 and a deep N-type well region 120 are placed. Select gates 700a, 700b, 700c and 700d for access transistors may be symmetrically formed with the same length. Herein, the transistor may include a floating gate 200, a dielectric layer 300, and a control gate 400.

Herein, because an etch-back process is executed without a mask when forming an access transistor, select gates 700a, 700b, 700c and 700d for access transistors may be symmetrically formed with the same length.

Thus, as a semiconductor device 100 including a non-volatile memory cell, engineered by the manufacturing method of a semiconductor device including a flash memory cell has select gates 700a, 700b, 700c and 700d for access transistors that are symmetrically formed with the same length, electrical performance is identical and allows for an easier shrinking of an access transistor.

According to the manufacturing method of a semiconductor device, including a flash memory cell, gate polysilicon of each access transistor is symmetrically formed by an improved process, allowing for an easier shrinking of an access transistor.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing method of a semiconductor device, the method comprising:
   providing a substrate;
   forming a gate stack comprising a floating gate conductive layer, a dielectric layer, a control gate conductive layer, and a hard mask layer on the substrate;
   forming a select gate conductive layer on the substrate and the gate stack;
   performing a patterning process on the select gate conductive layer, the hard mask layer, and the control gate conductive layer to form a select gate pattern, a hard mask, and a control gate, respectively, on the substrate, wherein the select gate pattern remains on the hard mask after the patterning process; and performing an etch-back process on the select gate pattern to thin out the select gate pattern to form a select gate that is lower in height than a top surface of the control gate.

2. The manufacturing method of claim 1, further comprising:
forming a deep N-type well region in the substrate;
forming a P-type well region on the deep N-type well region; and
forming a thin gate insulating layer between the floating gate conductive layer and the P-type well region.

3. The manufacturing method of claim 1, wherein the performing of the patterning process comprises:
forming a mask pattern on the select gate conductive layer;
etching the select gate conductive layer, the hard mask layer, and the control gate conductive layer until the dielectric layer or the floating gate layer is exposed; and
removing the mask pattern.

4. The manufacturing method of claim 1, further comprising:
etching the floating gate conductive layer to form a floating gate on the substrate.

5. The manufacturing method of claim 1, further comprising:
removing the hard mask disposed on the control gate;
forming a source region and a drain region on the substrate; and
forming a silicide layer on the source region and the drain region.

6. The manufacturing method of claim 5, further comprising:
forming an etch stop layer on the silicide layer;
forming an inter-layer insulating film on the etch stop layer;
forming contact plugs connected to the source region and the drain region by etching the inter-layer insulating film using the etch stop layer; and
forming metal wirings connected to the contact plugs.

7. The manufacturing method of claim 1, wherein the dielectric layer comprises a first oxide layer, a second nitride layer, and a third oxide layer.

8. The manufacturing method of claim 1, wherein the performing of the etch-back process comprises:
removing a portion of the select gate pattern disposed on the hard mask to form the select gate.

9. The manufacturing method of claim 1, wherein the select gate is disposed on a sidewall of the control gate.

10. A manufacturing method of a semiconductor device, the method comprising:
forming a gate stack comprising a floating gate layer, a dielectric layer, a control gate layer and a hard mask layer, on a substrate;
forming a select gate layer on the substrate and the gate stack;
patterning the select gate layer, the hard mask layer and the control gate layer, thereby forming a select gate pattern, a hard mask and a control gate, respectively, wherein the select gate pattern remains on the hard mask after the patterning of the select gate layer;
thinning the select gate pattern to form a select gate with a lower height than an upper surface of the control gate; and
patterning the floating gate layer to form a floating gate.

11. The method of claim 10, wherein the patterning of the select gate layer, the hard mask layer and the control gate layer comprises:
forming a mask pattern on the select gate layer; and
etching the select gate layer, the hard mask layer and the control gate layer until the dielectric layer or the floating gate layer is exposed.

12. The method of claim 10, further comprising:
etching the floating gate layer to form the floating gate on the substrate.

13. The manufacturing method of claim 10, further comprising:
removing the hard mask disposed on the control gate;
forming a source region and a drain region on the substrate; and
forming silicide layers on the source region and the drain region.

14. The method of claim 10, wherein the select gate is formed on a sidewall of the control gate.

15. A method of manufacturing a semiconductor device, the method comprising:
forming a gate stack comprising a floating gate layer, a dielectric layer, a control gate layer and a hard mask layer on a substrate;
forming a select gate layer on a select gate insulating layer;
patterning the select gate layer, the hard mask layer and the control gate layer, thereby forming a patterned select gate, a hard mask and a control gate, respectively, on the substrate, wherein the patterned select gate remains on the hard mask after the patterning of the select gate layer;
thinning the patterned select gate to form a select gate with a lower height than an upper surface of the control gate;
removing the hard mask disposed on the control gate;
forming a source region and a drain region on the substrate; and
forming silicide layers on the source region, the drain region, and the control gate.

16. The method of claim 15, wherein the patterning of the select gate layer, the hard mask layer, and the control gate layer comprises:
forming a mask pattern on the select gate layer; and
etching the select gate layer, the hard mask layer, and the control gate layer until the dielectric layer or the floating gate layer is exposed.

17. The method of claim 15, further comprising:
etching the floating gate layer to form a floating gate on the substrate.

* * * * *